US010492323B2

(12) United States Patent
Jean et al.

(10) Patent No.: US 10,492,323 B2
(45) Date of Patent: Nov. 26, 2019

(54) THREE-DIMENSIONAL ANGULAR ADJUSTING AND POSITIONING DEVICE

(71) Applicant: Wen-Fong Jean, Taoyuan (TW)

(72) Inventors: Wen-Fong Jean, Taoyuan (TW); Tai-Lien Huang, Taoyuan (TW); Sen-Hung Chen, Taoyuan (TW)

(73) Assignee: Wen-Fong Jean, Taoyuan (TW)

( * ) Notice: Subject to any disclaimer, the term of this patent is extended or adjusted under 35 U.S.C. 154(b) by 0 days.

(21) Appl. No.: 16/256,263

(22) Filed: Jan. 24, 2019

(65) Prior Publication Data

US 2019/0281720 A1 Sep. 12, 2019

(30) Foreign Application Priority Data

Mar. 6, 2018 (TW) .............................. 107107423 A

(51) Int. Cl.
| H05K 7/14 | (2006.01) |
| G06F 1/16 | (2006.01) |
| F16C 11/04 | (2006.01) |
| H05K 7/18 | (2006.01) |
| H05K 7/12 | (2006.01) |

(52) U.S. Cl.
CPC ............ H05K 7/1401 (2013.01); F16C 11/04 (2013.01); G06F 1/16 (2013.01); H05K 7/12 (2013.01); H05K 7/18 (2013.01)

(58) Field of Classification Search
CPC .......... H05K 7/1401; H05K 7/12; H05K 7/18; F16C 11/04; G06G 1/16
See application file for complete search history.

(56) References Cited

FOREIGN PATENT DOCUMENTS

| CN | 206246957 U | * | 6/2017 |
| JP | 2013110543 A | | 6/2013 |
| JP | 2016102543 A | | 6/2016 |
| TW | I414231 B | | 11/2013 |
| TW | I510170 B | | 11/2015 |

OTHER PUBLICATIONS

CN206246957U—Drawings (Year: 2017).*

* cited by examiner

*Primary Examiner* — Jinhee J Lee
*Assistant Examiner* — Ingrid D Wright
(74) *Attorney, Agent, or Firm* — Kirton McConkie; Evan R. Witt

(57) ABSTRACT

The present invention provides a three-dimensional angular adjusting and positioning device, which comprises a fixing member, a first adjusting member and a second adjusting member. The relative positions of the second adjusting member, the first adjusting member and the fixing member are adjusted by switching an arm with an eccentric cam of the second adjusting member to drive two engaging portions between the fixing member and the first adjusting member and two engaging portions between the first adjusting member and the second adjusting member. While the engaging portions are separated from each other, an adjustable state is achieved. While the engaging portions are engaged with each other, a positioned state is achieved. Thus, the electronic equipment mounted on three-dimensional angular adjusting and positioning device can be adjusted to a specific angle and then positioning according to the practical requirements. It avoids the displacement due to the collision or gravity.

16 Claims, 21 Drawing Sheets

THREE-DIMENSIONAL ANGULAR ADJUSTING AND POSITIONING DEVICE

FIELD OF THE INVENTION

The present invention relates to an angular adjusting and positioning device, and more particularly to a three-dimensional angular adjusting and positioning device.

BACKGROUND OF THE INVENTION

With the popularization of common electronic equipment, users choose such electronic equipment on consideration of the convenience of installation, and also expect that the installed electronic equipment can be adjusted in multiple angles and positioned at a specific angle according to the different requirements of the applied environments.

An electronic equipment on a transportation vehicle is taken as an example, wherein a common adjustable screen or a satellite antenna usually needs to be adjusted according to a specific applied environments or actual application requirements, and further positioned at a specific angle. However, such electronic equipment must be completely positioned at a specific angle during use and cannot be carried by a conventional universal rotating shaft due to the heavier weight thereof. Hence, the angular adjusting and positioning functions cannot be simultaneously achieved by the conventional universal rotating shaft.

On the other hand, the angular adjusting and positioning device commonly used in such electronic equipment on the current market only provides the angular adjusting function on two-dimensional such as horizontal plane, and achieves simple positioning by high frictional resistance. In that, the range of the adjustable angle is limited, the operation of the electronic equipment is time-consuming to adjust angle due to the high frictional resistance and it fails to meet the actual application requirements.

Therefore, there is a need of providing a three-dimensional angular adjusting and positioning device capable of carrying an electronic equipment mounted thereon and providing the mounted and carried electronic equipment with the angular adjusting and positioning functions at the same time, so as to address the above-mentioned issues.

SUMMARY OF THE INVENTION

An object of the present invention is to provide a three-dimensional angular adjusting and positioning device. With an eccentric cam rotated by a single arm to switch the relative positions of the components, the engaging portions of the components are driven to separate or engage. Thereby, the three-dimensional angular adjusting and positioning device can be freely adjusted and positioned at a specific angle according to the practical requirements. Moreover, an electronic equipment can be mounted and carried thereon simply and it benefits to avoid the angular displacement of the mounted and carried electronic equipment due to the collision or the gravity.

Another object of the present invention is to provide a three-dimensional angular adjusting and positioning device for simply mounting and carrying an electronic equipment and facilitating the mounted and carried electronic equipment to achieve a three-dimensional angular adjustment and position. The structure of the three-dimensional angular adjusting and positioning device is compact and can be assembled easily. With an eccentric cam rotated by a single arm to switch the relative positions of the components, the engaging portions of the components are driven to separate or engage. Thereby, an electronic equipment mounted and carried on the three-dimensional angular adjusting and positioning device can be freely adjusted and positioned at a specific angle according to the practical requirements. It also benefits to avoid the angular displacement of the mounted and carried electronic equipment due to the collision or the gravity.

Other object of the present invention is to provide a three-dimensional angular adjusting and positioning device. The structure of the three-dimensional angular adjusting and positioning device is compact and can be assembled easily. The angular adjusting and positioning operations are performed without an additional tool. An eccentric cam disposed therein can be rotated by a single arm to switch the relative positions of the components, and the engaging portions of the components are driven to separate or engage, so as to achieve the operations of fastening or unfastening. It facilitates the three-dimensional angular adjusting and positioning device to be freely adjusted and positioned at a specific angle according to the practical requirements and then fastened firmly at the specific angle.

In accordance with an aspect of the present invention, a three-dimensional angular adjusting and positioning device is provided and includes a fixing member, a first adjusting member and a second adjusting member. The fixing member includes a base portion, a first engaging portion, a first shaft and a ring portion. The first engaging portion is disposed on the base portion. The ring portion includes a sleeving opening. The ring portion and the base portion are in connection with two opposite ends of the first shaft, respectively. The first adjusting member includes an accommodation opening, a shaft channel, a second engaging portion, a third engaging portion and at least one inclined plane. The accommodation opening is in communication with a first end of the shaft channel, and the first adjusting member is pivotally connected with the fixing member by the first shaft located through the shaft channel so as to rotate the first adjusting member to a first specific angle relative to the fixing member around the first shaft. The ring portion of the fixing member is accommodated within the accommodation opening, the second engaging portion is matched with the first engaging portion and disposed adjacent to a second end of the shaft channel, and the third engaging portion and the at least one inclined plane are disposed adjacent to two opposite ends of the accommodation opening, respectively. The second adjusting member includes a first sub-member and a second sub-member disposed adjacent to the two opposite ends of the accommodation opening, respectively. The first sub-member includes a fourth engaging portion matched with the third engaging portion. The second sub-member includes a second shaft, an eccentric cam, at least one pushing portion and an arm. The at least one pushing portion is matched with the at least one inclined plane, the second shaft runs through the accommodation opening and the ring portion, and the first sub-member is connected with the second shaft to rotate to a second specific angle relative to the first adjusting member around the second shaft. The eccentric cam is disposed around the second shaft and received within the sleeving opening of the ring portion. When the arm drives the second sub-member to rotate to a specific position relative to the first adjusting member around the second shaft, the at least one pushing portion abuts against the at least one inclined plane to drive the fourth engaging portion of the first sub-member to engage with the third engaging portion of the first adjusting member, and the eccentric cam abuts against the ring portion to drive the second engaging portion of the first adjusting member to engage with the first engaging portion of the fixing member, so that the first adjusting member and the first sub-member of the second adjusting member are positioned at the first specific angle and the second specific angle, respectively.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
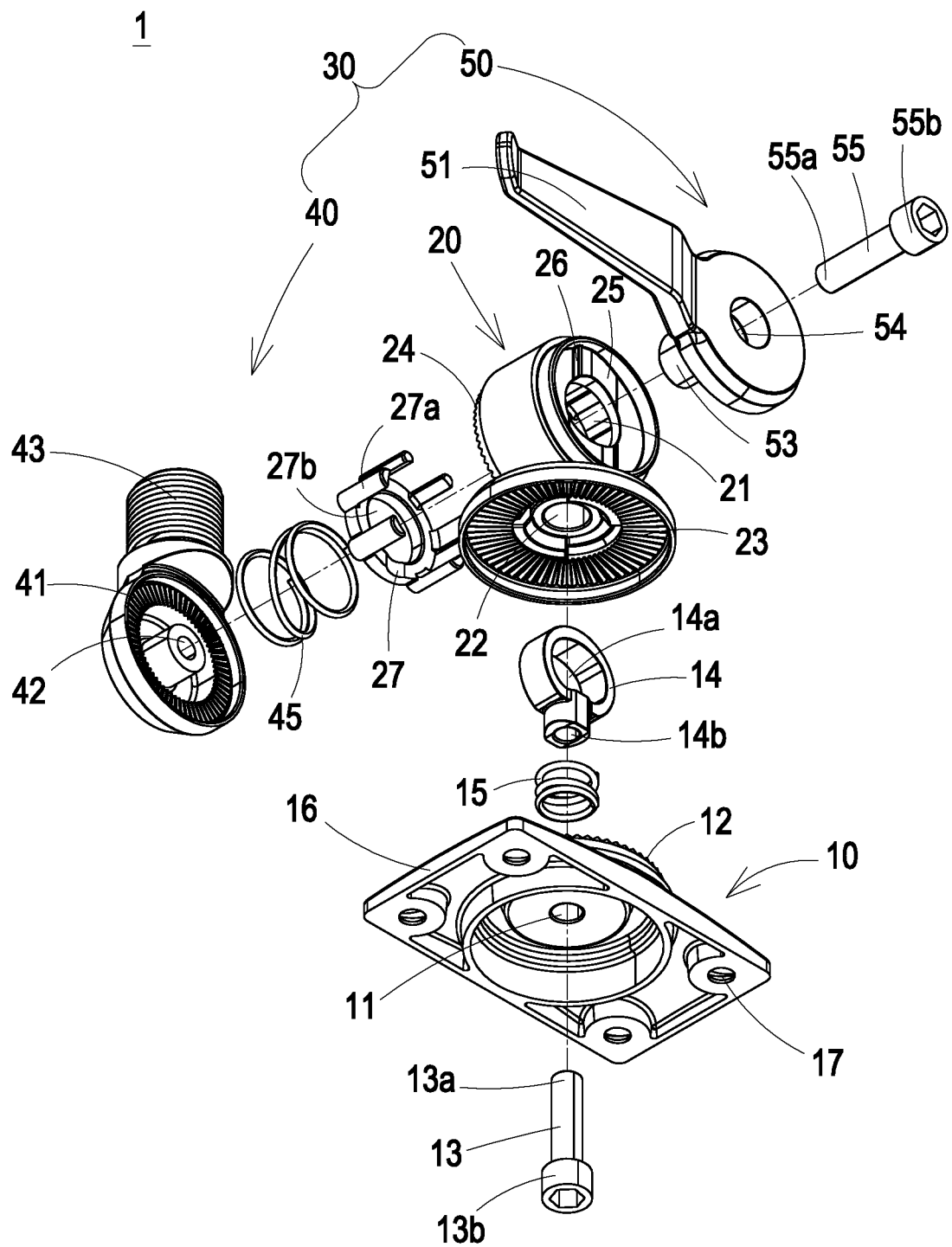
FIG. 1 is an exploded view illustrating a three-dimensional angular adjusting and positioning device according to a first embodiment of the present disclosure.
Figure 2:
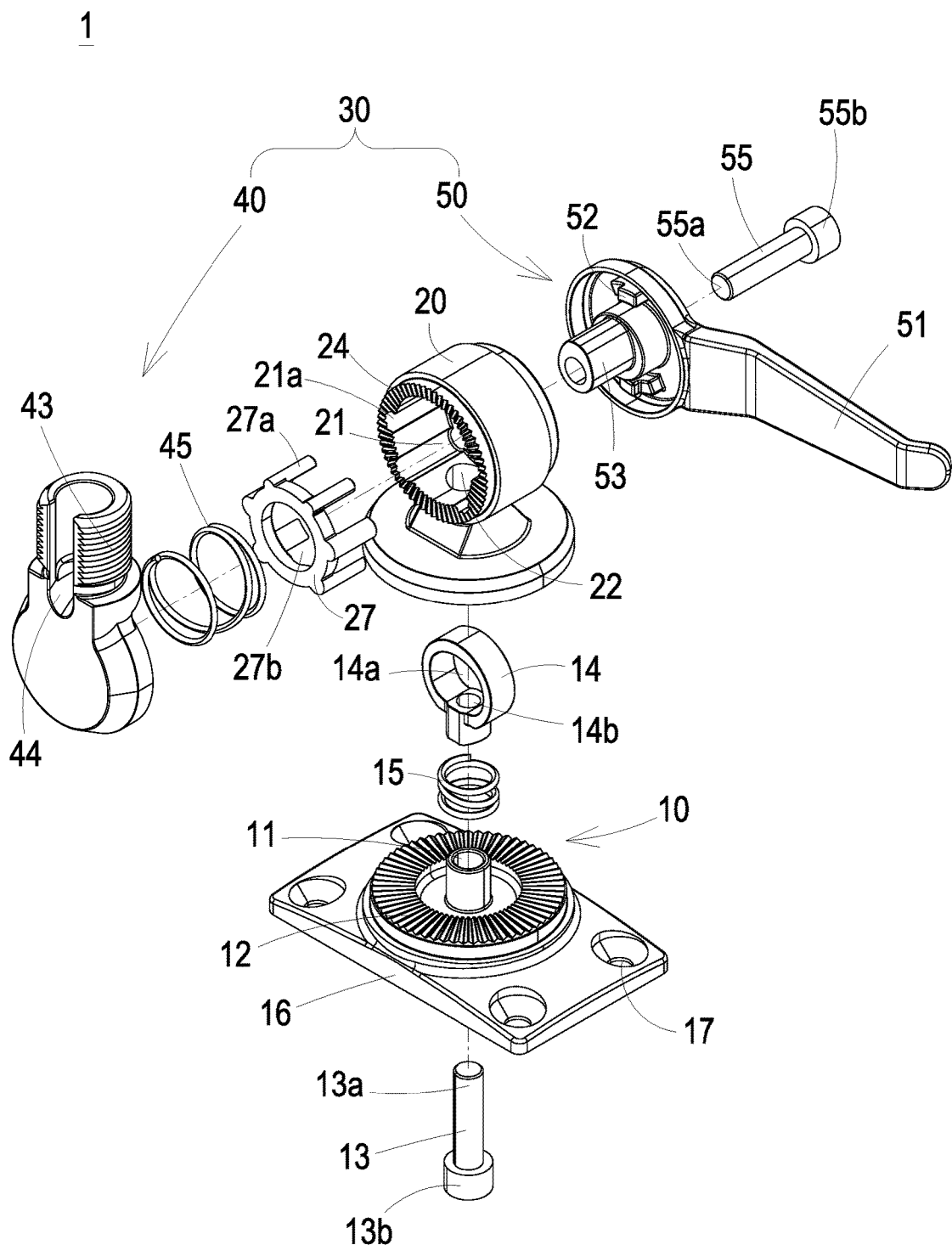
FIG. 2 is another explode view illustrating the three-dimensional angular adjusting and positioning device according to the first embodiment of the present disclosure and taken from a different perspective.
Figure 3:
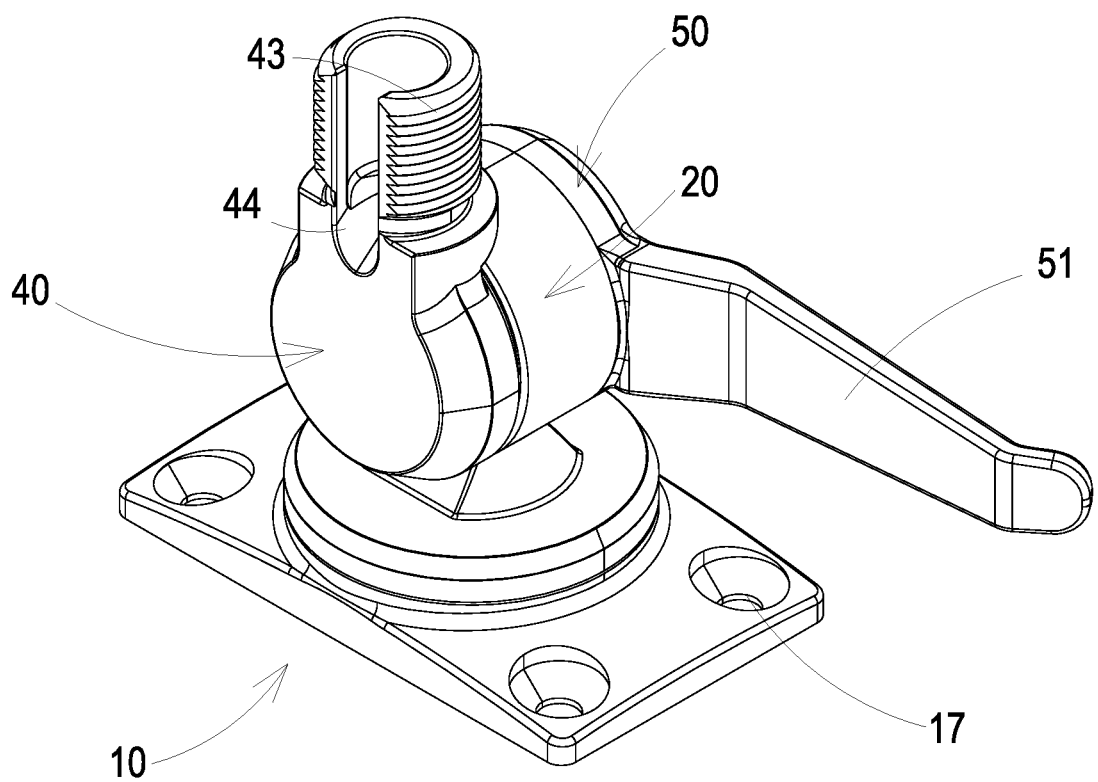
FIG. 3 is a perspective structural view illustrating the three-dimensional angular adjusting and positioning device according to the first embodiment of the present disclosure.
Figure 4:
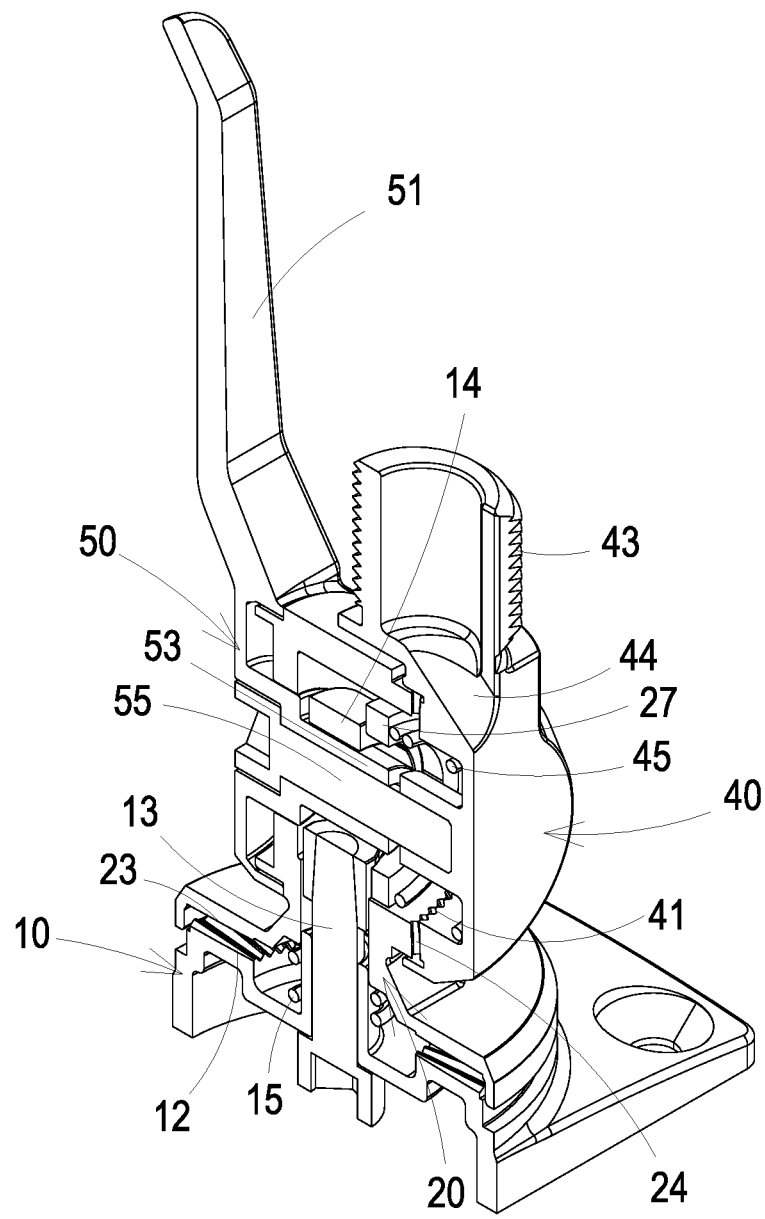
FIG. 4 is a cross-sectional structural view illustrating the three-dimensional angular adjusting and positioning device which is set in an angular adjustable state according to the first embodiment of the present disclosure.
Figure 5:
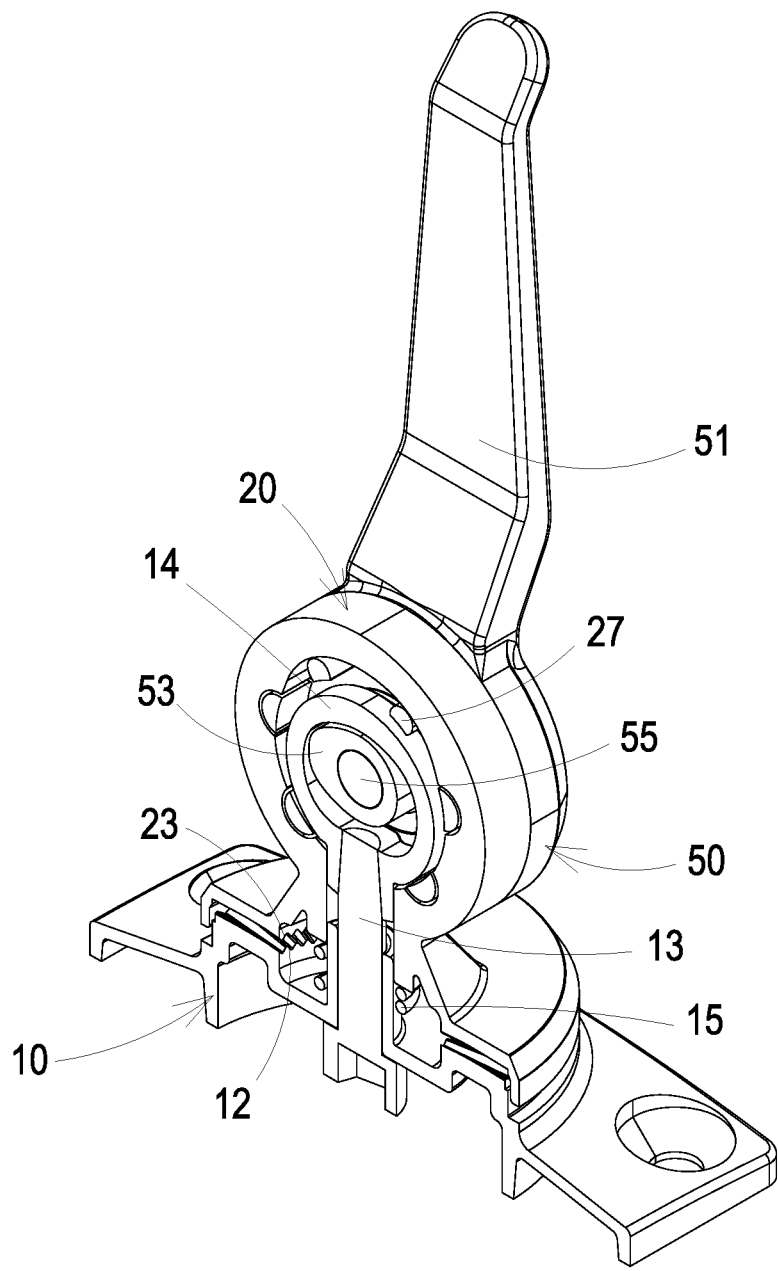
FIG. 5 is another cross-sectional structural view illustrating the three-dimensional angular adjusting and positioning device which is set in an angular adjustable state according to the first embodiment of the present disclosure.
Figure 6:
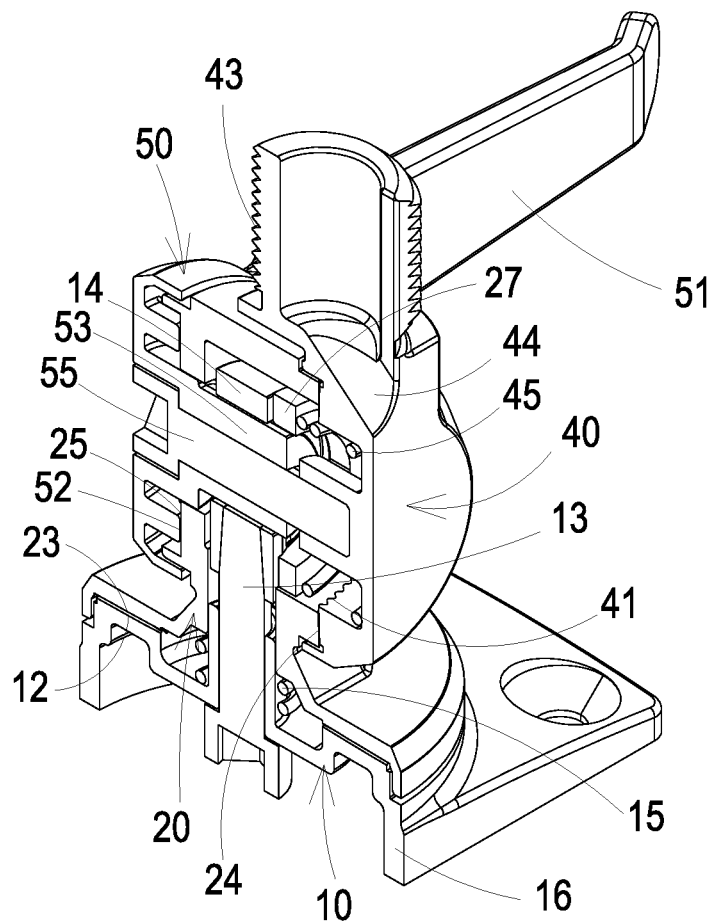
FIG. 6 is a cross-sectional structural view illustrating the three-dimensional angular adjusting and positioning device which is set in an angular positioned state according to the first embodiment of the present disclosure.
Figure 7:
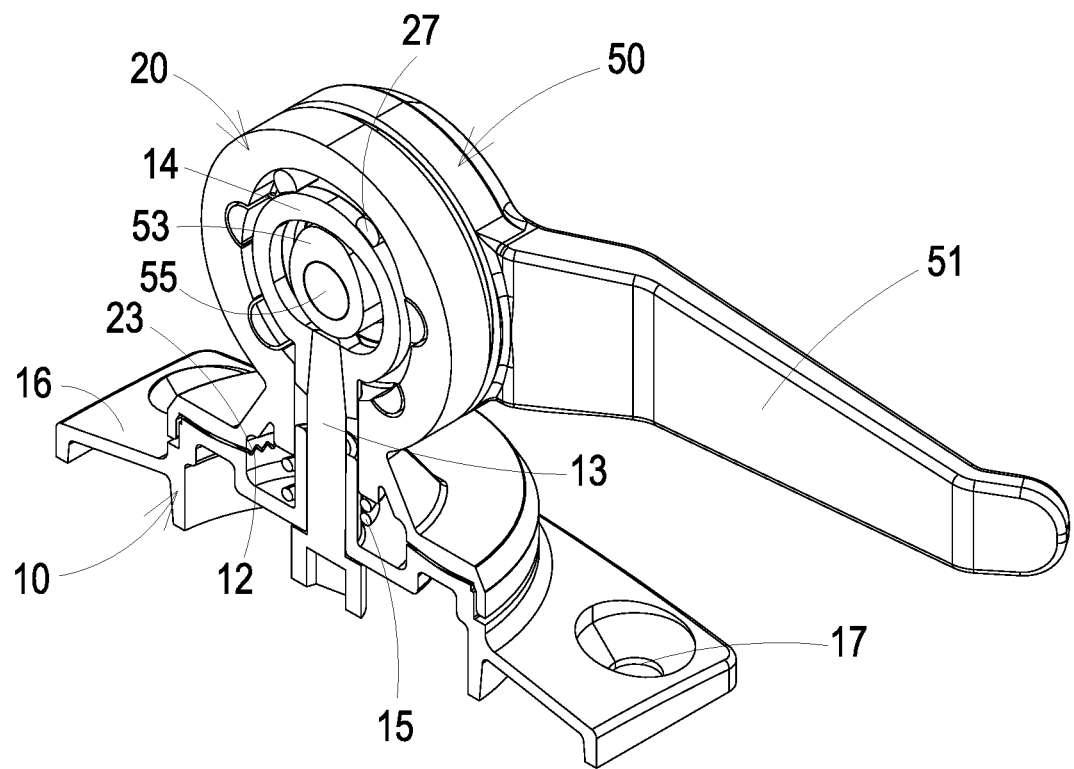
FIG. 7 is another cross-sectional structural view illustrating the three-dimensional angular adjusting and positioning device which is set in an angular positioned state according to the first embodiment of the present disclosure.

FIGS. 1 and 2 are exploded views illustrating a three-dimensional angular adjusting and positioning device according to a first embodiment of the present disclosure. FIG. 3 is a perspective structural view illustrating the three-dimensional angular adjusting and positioning device according to the first embodiment of the present disclosure. FIGS. 4 and 5 are cross-sectional structural views illustrating the three-dimensional angular adjusting and positioning device which is set in an adjustable state according to the first embodiment of the present disclosure. FIGS. 6 and 7 are cross-sectional structural views illustrating the three-dimensional angular adjusting and positioning device which is set in an angular positioned state according to the first embodiment of the present disclosure. In the embodiment, the three-dimensional angular adjusting and positioning device 1 includes a fixing member 10, a first adjusting member 20 and a second adjusting member 30. The fixing member 10 includes a base portion 16, a first engaging portion 12, a first shaft 13 and a ring portion 14. The first engaging portion 12 is disposed on the base portion 16. The ring portion 14 includes a sleeving opening 14a. The ring portion 14 and the base portion 16 are in connection with two opposite ends of the first shaft 13, respectively. In the embodiment, the fixing member 10 further includes a first fastening hole 11 disposed on the base portion 16. The first shaft 13 includes a pivoting end 13a and a stopper end 13b disposed relative to each other and located at two opposite ends of the first shaft 13. The stopper end 13b is mounted on an end of the first fastening hole 11. The first shaft 13 is extended outwardly from another end of the first fastening hole 11, and the pivoting end 13a of the first shaft 13 is pivotally connected with a pivoted hole 14b of the ring portion 14. Thus, the ring portion 14 can be rotated freely around the first shaft 13. In the embodiment, the base portion 16 of the fixing member 10 further includes at least one fixing hole 17, which is configured to fasten the three-dimensional angular adjusting and positioning device 1 on an object (not shown) by at least one bolt (not shown) engaging with the fixing hole 17.

In the embodiment, the first adjusting member 20 includes an accommodation opening 21, a shaft channel 22, a second engaging portion 23, a third engaging portion 24, at least one inclined plane 25 and a mounting ring set 27. The accommodation opening 21 is in communication with the first end of the shaft channel 22. The first adjusting member 20 is pivotally connected with the first shaft 13 through the shaft channel 22, so that the first adjusting member 20 can be rotated freely to a first specific angle relative to the fixing member 10 around the first shaft 13. Furthermore, in the embodiment, in addition to the first adjusting member 20 pivotally connected with the first shaft 13 of the fixing member 10 through the shaft channel 22, the ring portion 14 of the fixing member 10 is accommodated within the accommodation opening 21 of the first adjusting member 20. Furthermore, the second engaging portion 23 of the first adjusting member 20 is matched with the first engaging portion 12 of the fixing member 10. The second engaging portion 23 is located adjacent to an end of the shaft channel 22. On the other hand, the third engaging portion 24 and the at least one inclined plane 25 of the first adjusting member 20 are disposed on two opposite ends of the accommodation opening 21. In the embodiment, the mounting ring set 27 is disposed within the accommodation opening 21 and partially covering around the outer edge of the ring portion 14, so that the ring portion 14 is limited within the accommodation opening 21. In the embodiment, the first adjusting member 20 includes a plurality of positioning slots 21a located through the accommodation opening 21 and disposed around the accommodation opening 21. Moreover, the mounting ring set 27 further including a plurality of supporting pins 27a spatially corresponding to the plurality of positioning slots 21a and disposed around the ring portion 14, so that the mounting ring set 27 is firmly mounted in the accommodation opening 21 and the ring portion 14 is limited in the accommodation opening 21. In the embodiment, the mounting ring set 27 further includes a through opening 27b aligned with the sleeving opening 14a of the ring portion 14.

In the embodiment, the second adjusting member 30 includes a first sub-member 40 and a second sub-member 50 disposed adjacent to the two opposite ends of the accommodation opening 21 of the first adjusting member 20, respectively. In the embodiment, the first sub-member 40 includes a fourth engaging portion 41. The fourth engaging portion 41 is spatially corresponding to the third engaging portion 24 of the first adjusting member 20. In addition, the second sub-member 50 is spatially corresponding to the first sub-member 40 and disposed adjacent to another opposite end of the accommodation opening 21. The second sub-member 50 includes a second shaft 55, an eccentric cam 53, at least one pushing portion 52 and an arm 51. The at least one pushing portion 52 is match with the at least one inclined plane 25 of the first adjusting member 20. The first sub-member 40 and the second sub-member 50 are pivotally connected with each other through the second shaft 55 and maintained a fixing distance. Moreover, the second shaft 55 runs through the accommodation opening 21 of the first adjusting member 20, the sleeving opening 14a of the ring portion 14 of the fixing member 10 and the through opening 27 of the mounting ring set 27 of the first adjusting member 20, and is connected with the first sub-member 40. Thus, the first sub-member 40 of the second adjusting member 30 can be freely rotated to a second specific angle relative to the first adjusting member 20 around the second shaft 55. In the embodiment, the second sub-member 50 further includes a second fastening hole 54 disposed thereon. The second shaft 55 includes a pivoting end 55a and a stopper end 55b disposed relative to each other and disposed on two opposite ends of the second shaft 55. The stopper end 55b is mounted on an end of the second fastening hole 54. The second shaft 55 is extended outwardly from another end of the second fastening hole 54 and located through the accommodation opening 21 and the ring portion 14. The pivoting end 55a is pivotally connected with a pivoting hole 42 of the first sub-member 40, so that the first sub-member 40 can be rotated freely around the second shaft 55.

It is noted that, the eccentric cam 53 of the second sub-member 50 is disposed on the second shaft 55. For example, the second shaft 55 runs through the eccentric cam 53, and is accommodated within the sleeving opening 14a of the ring portion 14 of the fixing member 10. In another embodiment, the eccentric cam 53 and the second shaft 55 are integratedly formed into one piece. It should be emphasized that the combining method for the eccentric cam 53 and the second shaft 55 is not an essential feature to limit the present disclosure, and not redundantly described herein. In the embodiment, the fixing member 10 includes a first elastic component 15, which can be for example but not limited to a spring, disposed between the fixing member 10 and the first adjusting member 20, so that the second engaging portion 23 of the first adjusting member 20 and the first engaging portion 12 of the fixing member 10 are maintained to space apart and not engage with each other. In that way, the first adjusting member 20 can be rotated freely to the first specific angle relative to the fixing member 10 around the first shaft 13. Furthermore, the ring portion 14 accommodated within the accommodation opening 21 of the first adjusting member 20 is rotated synchronously to drive the second adjusting member 30 to rotate. Namely, the first adjusting member 20 of the three-dimensional angular adjusting and positioning device 1 is set in an adjustable state, as shown in FIGS. 4 and 5. Similarly, the first sub-member 40 further includes a second elastic component 45, which can be for example but not limited to a spring, disposed between the first sub-member 40 and the first adjusting member 20, so that the third engaging portion 24 of the first adjusting member 20 and the fourth engaging portion 41 of the first sub-member 40 are maintained to space apart and not engage with each other. In that way, the first sub-member 40 of the second adjusting member 30 can be rotated freely to the second specific angle relative to the first adjusting member 20 around the second shaft 55. Namely, the second adjusting member 30 is of the three-dimensional angular adjusting and positioning device 1 is set in an adjustable state as shown in FIG. 4. In the embodiment, the second elastic component 45 is further disposed between the first sub-member 40 and the mounting ring set 27 of the first adjusting member 20 and not in contact with the ring portion 14 accommodated within the accommodation opening 21. It avoids to influence the eccentric cam 53 to abut against or release the ring portion 14. Namely, the second elastic component 45 and the ring portion 14 are separated apart by the mounting ring set 27 and the mounting ring set 27 also provides a supporting surface for the second elastic component 45 abutting thereagainst.

On the other hand, as shown in FIGS. 6 and 7. When the arm 51 drives the second sub-member 50 to rotate to a specific position relative to the first adjusting member 20 around the second shaft 55, the at least one pushing portion 52 abuts against the at least one inclined plane 25 to drive the fourth engaging portion 41 of the first sub-member 40 and the third engaging portion 24 of the first adjusting member 20 to engage with each other. At the same time, the eccentric cam 53 abuts against the inner wall of the ring portion 14 to drive the second engaging portion 23 of the first adjusting member 20 to move for example downwardly and engage with the first engaging portion 12 of the fixing member 10. Thus, the first adjusting member 20 and the first sub-member 40 of the second adjusting member 30 are positioned at the first specific angle and the second specific angle, respectively.

In other words, when the arm 51 drives the second sub-member 50 to rotate around the second shaft 55 and misalign the above specific position, the at least one pushing portion 52 of the second sub-member 50 is shifted away from the at least one inclined plane 25 of the first adjusting member 20. At the same time, the eccentric cam 53 releases the inner wall of the ring portion 14 of the fixing member 10 and not in abutting with the ring portion 14. Thus, the first elastic component 15 drives the second engaging portion 23 of the first adjusting member 20 to move away the first engaging portion 12 of the fixing member 10. At the same time, the second elastic component 45 drives the fourth engaging portion 41 of the first sub-member 40 to move away the third engaging portion 24 of the first adjusting member 20. In that way, the three-dimensional angular adjusting and positioning device 1 is set in the adjustable state, as shown in FIGS. 4 and 5. The first adjusting member 20 can be rotated freely to the first specific angle relative to the fixing member 10 around the first shaft 13 and the first sub-member 40 of the second adjusting member 30 can be rotated freely to the second specific angle relative to the first adjusting member 20 around the second shaft 55. It should be emphasized that the first elastic component 15 and the second elastic component 45 are not essential features to limit the present disclosure. In another embodiment, the first elastic component 15 and the second elastic component 45 are omitted. when the arm 51 drives the second sub-member 50 to rotate around the second shaft 55 and misalign the above specific position, the first engaging portion 12 of the fixing member 10 is not firmly engaged with the second engaging portion 23, and the third engaging portion 24 of the first adjusting member 20 is not firmly engaged with the fourth engaging portion 41 of the first sub-member 40. Thus, the first adjusting member 20 can be rotated freely to the first specific angle relative to the fixing member 10 around the first shaft 13 and the first sub-member 40 of the second adjusting member 30 can be rotated freely to the second specific angle relative to the first adjusting member 20 around the second shaft 55.

In the embodiment, the first sub-member 40 further includes a mounting portion 43 disposed on an edge of the first sub-member 40. When the first adjusting member 20 is rotated to the first specific angle relative to the fixing member 10 around the first shaft 13 and the first sub-member 40 is rotated to the second specific angle relative to the first adjusting member 20 around the second shaft 55, a relative angle is formed between the mounting portion 43 and the fixing member 10. The mounting portion 43 includes for example but not limited a screw thread, so that an electronic equipment, such as a screen, an antenna or other electron equipment, can be mounted and carried on the mounting portion 43. Thus, the mounted and carried electronic equipment, such as the screen, the antenna or the other electronic equipment can be adjusted freely to achieve a specific angle according to the practical requirements and fastened at a specific position firmly. Certainly, the mounted and carried electronic equipment, such as the screen, the antenna or the other electronic equipment won't influence the operation of the three-dimensional angular adjusting and positioning device 1. In an embodiment, the electronic equipment, such as the screen, the antenna or the other electronic equipment, is mounted and carried on the mounting portion 43 after the three-dimensional angular adjusting and positioning device 1 is adjusted and positioned at the relative angle. In another embodiment, the electronic equipment, such as the screen, the antenna or the other electronic equipment, is mounted and carried on the mounting portion 43 firstly, and then the three-dimensional angular adjusting and positioning device 1 is adjusted and positioned at the relative angle. Thereby, it avoids the angular displacement of the mounted and carried electronic equipment due to the collision or the gravity. In the embodiment, the first sub-member 40 further includes an accommodation groove 44 disposed adjacent to the mounting portion 43. The accommodation groove 44 is used for receiving a power cable or signal line of the installed electronic equipment, such as the screen, the antenna or the other electronic equipment. Certainly, the type of the mounting portion 43 and the accommodation groove 44, the installation angle, and the relative positions of each other can be adjusted according to the practical requirements, and not redundantly described herein. In addition, it should be emphasized that the mounting portion 43 of the three-dimensional angular adjusting and positioning device 1 is not limited to mount and carry the electronic equipment. In another embodiment, the mounting portion 43 of the three-dimensional angular adjusting and positioning device 1 is used for mounting and carrying a lamp, a flag, a fishing tackle or a support frame. It is not an essential feature to limit the present disclosure and not redundantly described herein.

In the embodiment, the first engaging portion 12 and the second engaging portion 23 are for example located around the outer edge of the first shaft 13. Thus, when the first adjusting member 20 is rotated freely to the first specific angle relative to the fixing member 10 around the first shaft 13, the first engaging portion 12 is maintained to align with the second engaging portion 23. Furthermore, when the arm 51 drives the second sub-member 50 to rotate to the specific position relative to the first adjusting member 20 around the second shaft 55, the first engaging portion 12 and the second engaging portion 23 are engaged with each other. Similarly, the third engaging portion 24 and the fourth engaging portion 41 are for example located around the outer edge of the second shaft 55. Thus, when the first sub-member 40 of the second adjusting member 30 is rotated freely to the second specific angle relative to the first adjusting member 20 around the second shaft 55, the third engaging portion 24 is maintained to align with the fourth engaging portion 41. Furthermore, when the arm 51 drives the second sub-member 50 to rotate to the specific position relative to the first adjusting member 20 around the second shaft 55, the third engaging portion 24 and the fourth engaging portion 41 are engaged with each other. The relative rotation angle between the first engaging portion 12 and the second engaging portion 23 can be designed according the practical requirement, and the relative rotation angle between the third engaging portion 24 and the fourth engaging portion 41 can be designed according the practical requirement. Thus, it facilities to limit the range of the first specific angle and the ranged of the second specific angle. However, it is not an essential feature to limit the present disclosure, and not redundantly described herein. In the embodiment, the first adjusting member 20 further includes at least one limitation portion 26 disposed adjacent to the at least one inclined plane 25 to limit a rotated angle of the second sub-member 50 relative to the first adjusting member 20 around the second shaft 55. It facilitates the user to rotate the arm 51 to switch the operations between the adjustment of angle and the position at the specific position.

Figure 8:
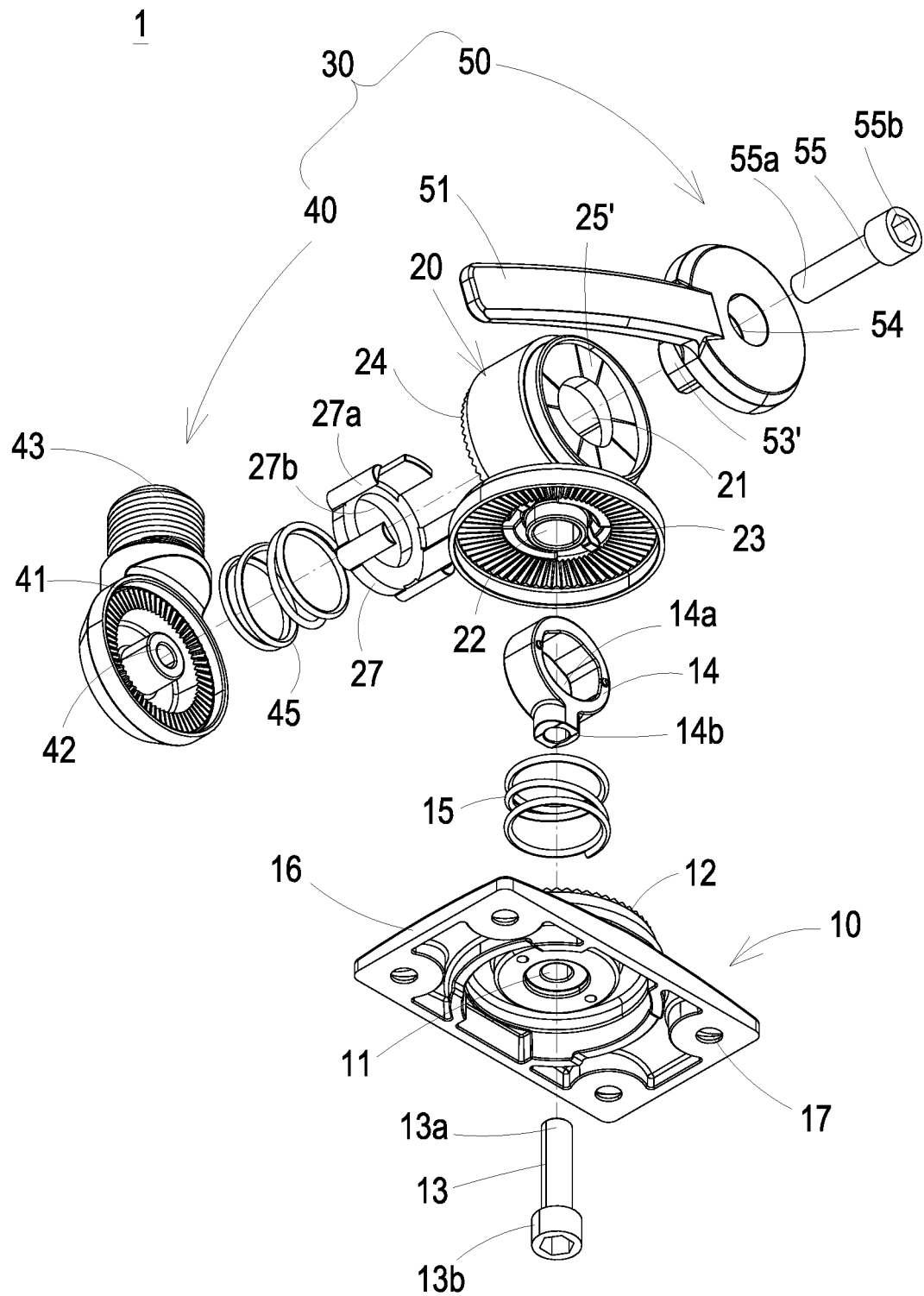
FIG. 8 is an exploded view illustrating a three-dimensional angular adjusting and positioning device according to a second embodiment of the present disclosure.
Figure 9:
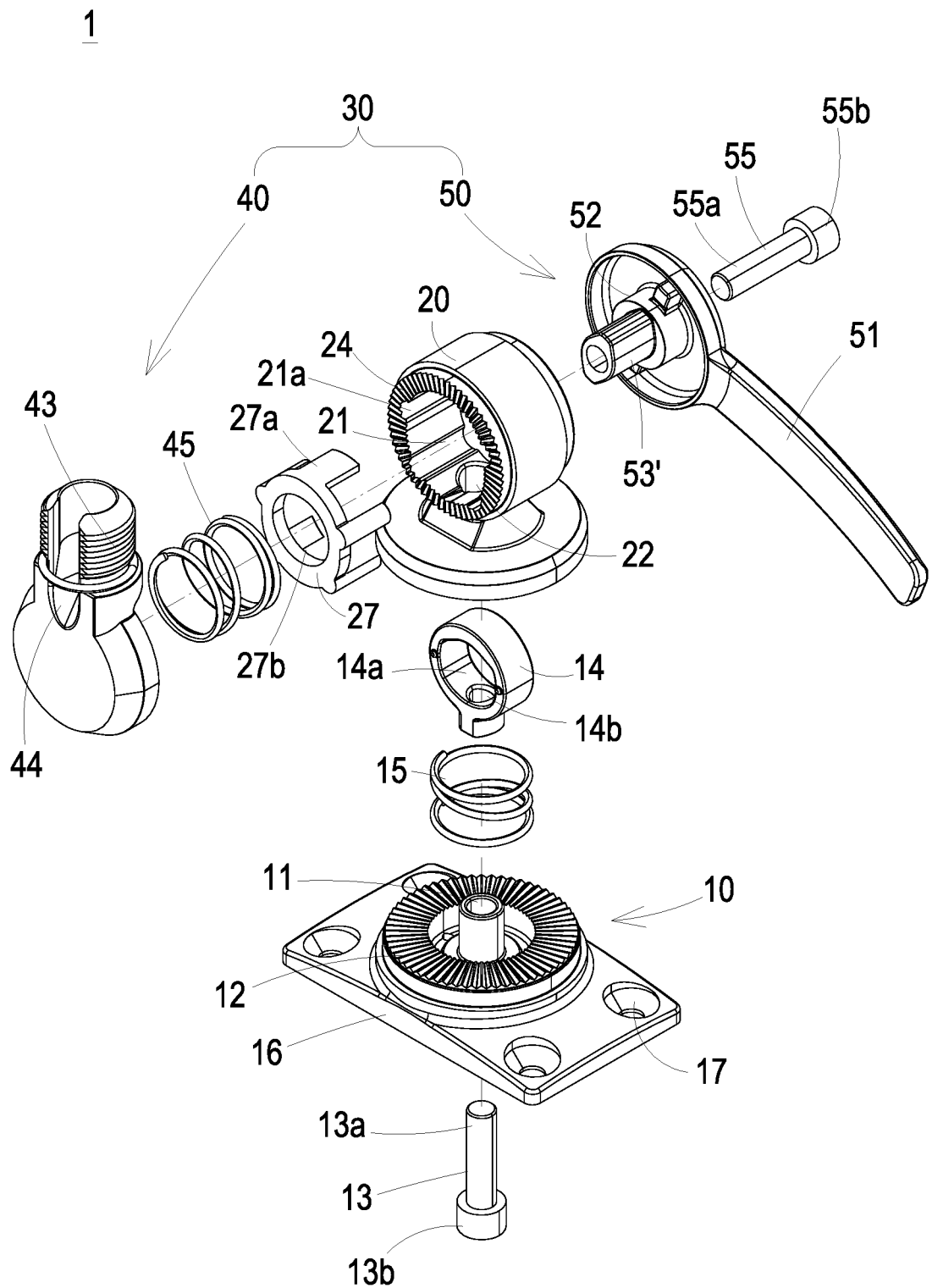
FIG. 9 is another explode view illustrating the three-dimensional angular adjusting and positioning device according to the second embodiment of the present disclosure and taken from a different perspective.
Figure 10:
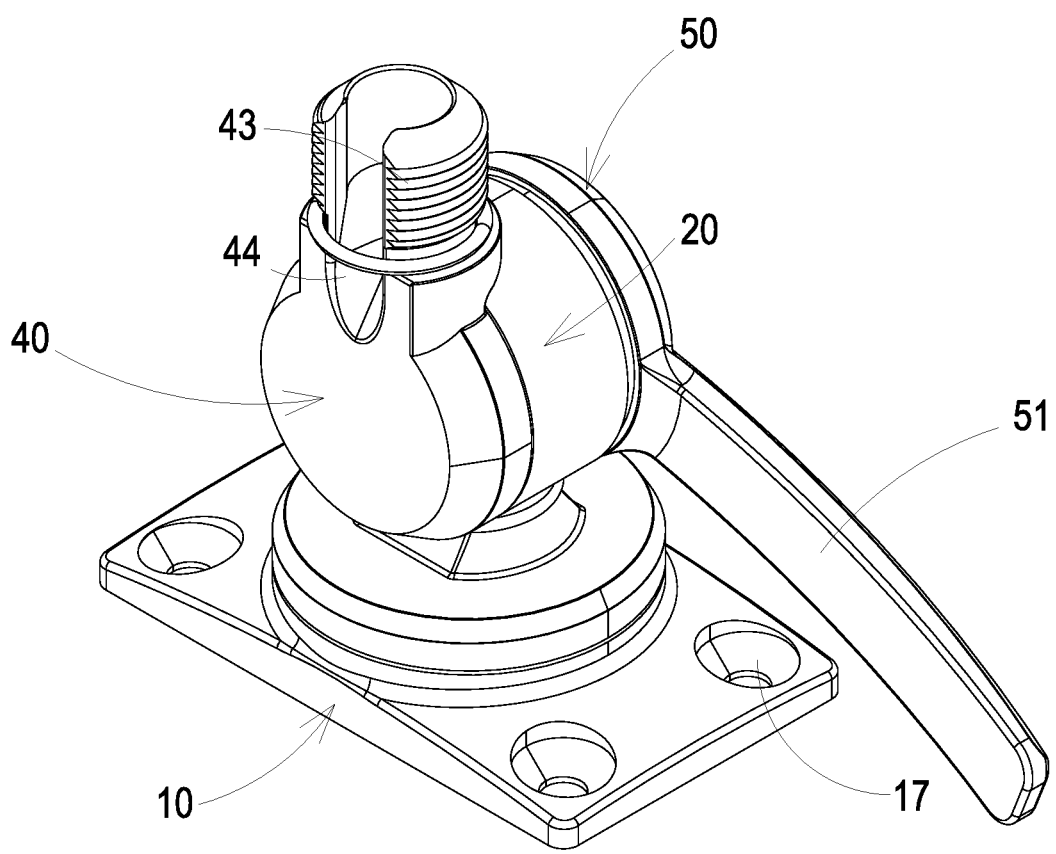
FIG. 10 is a perspective structural view illustrating the three-dimensional angular adjusting and positioning device according to the second embodiment of the present disclosure.
Figure 11:
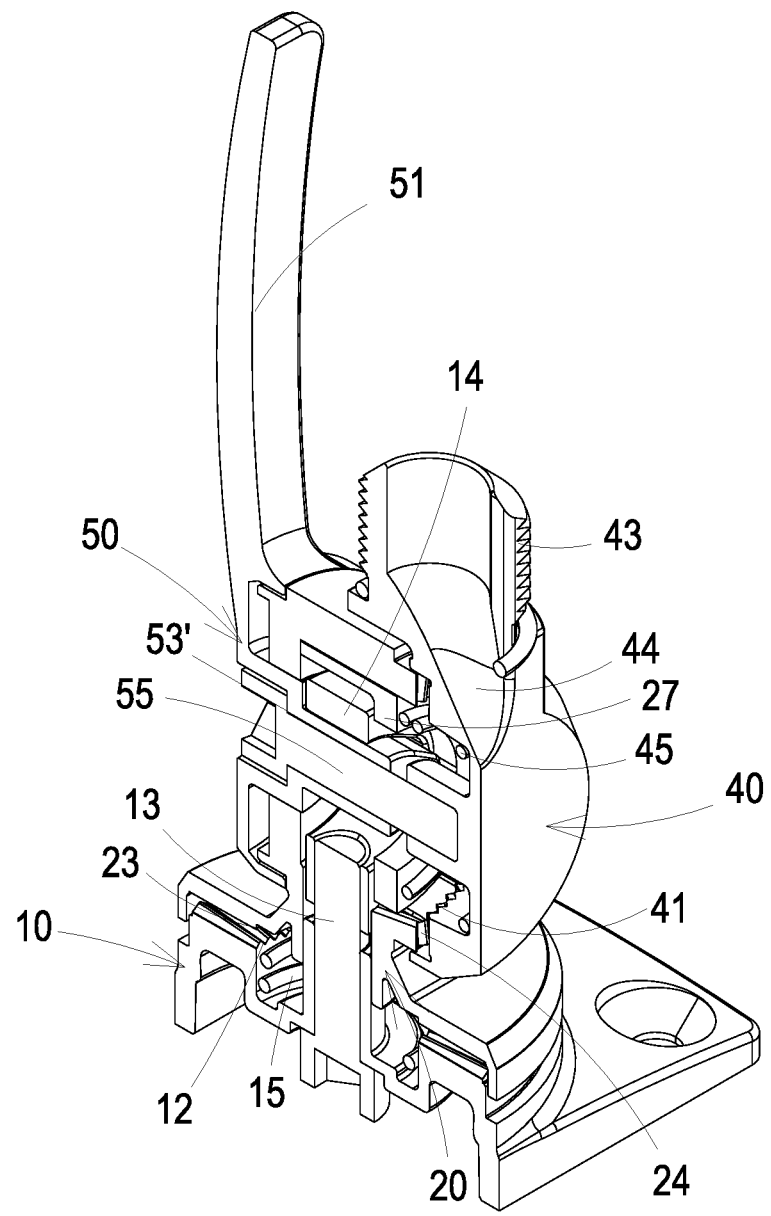
FIG. 11 is a cross-sectional structural view illustrating the three-dimensional angular adjusting and positioning device which is set in an angular adjustable state according to the second embodiment of the present disclosure.
Figure 12:
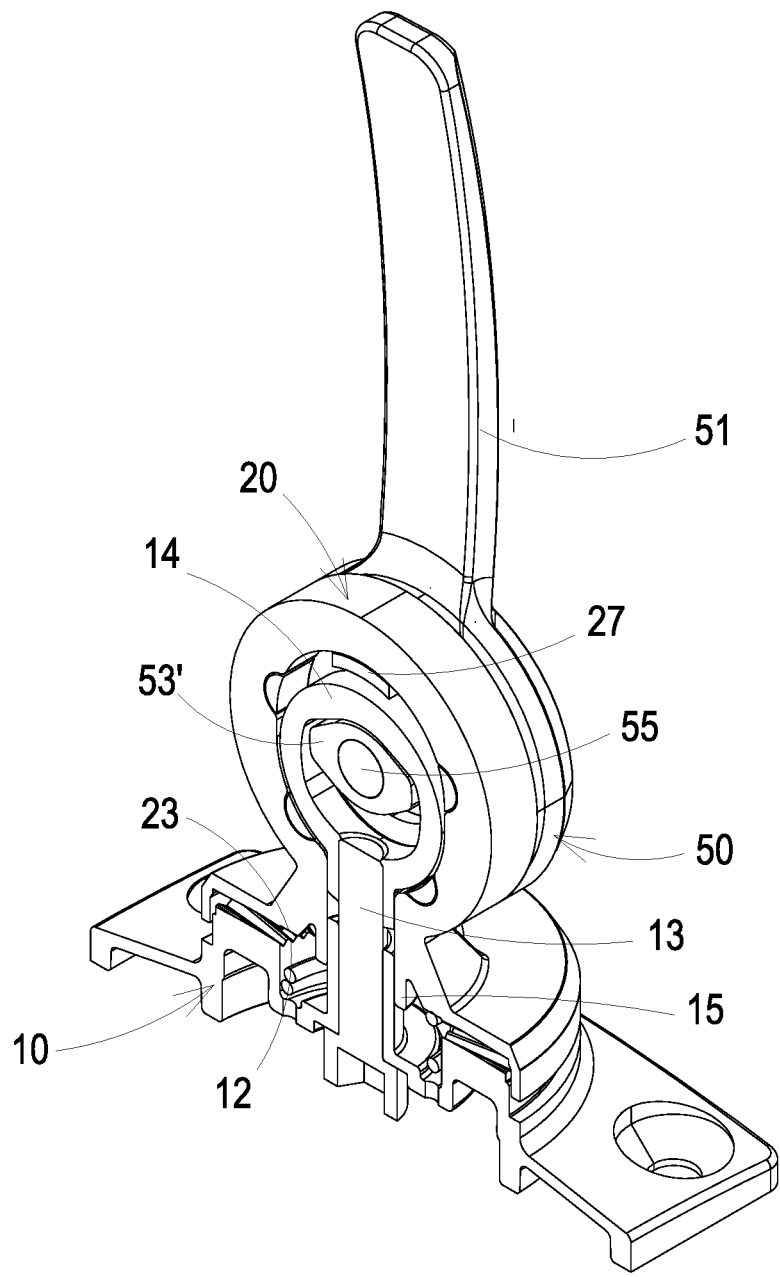
FIG. 12 is another cross-sectional structural view illustrating the three-dimensional angular adjusting and positioning device which is set in an angular adjustable state according to the second embodiment of the present disclosure.
Figure 13:
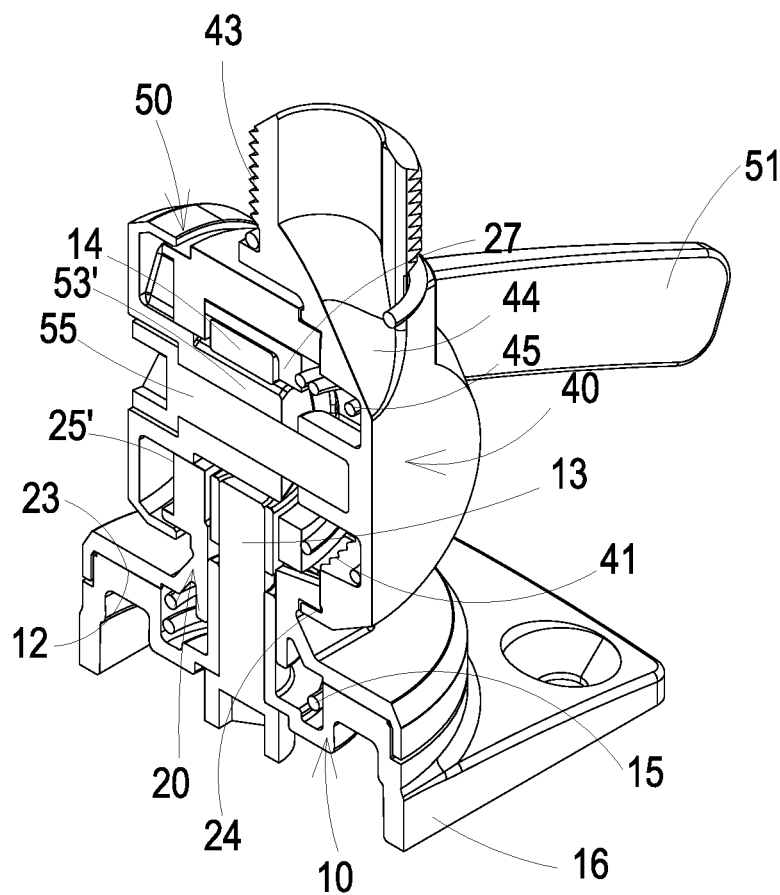
FIG. 13 is a cross-sectional structural view illustrating the three-dimensional angular adjusting and positioning device which is set in an angular positioned state according to the second embodiment of the present disclosure.
Figure 14:
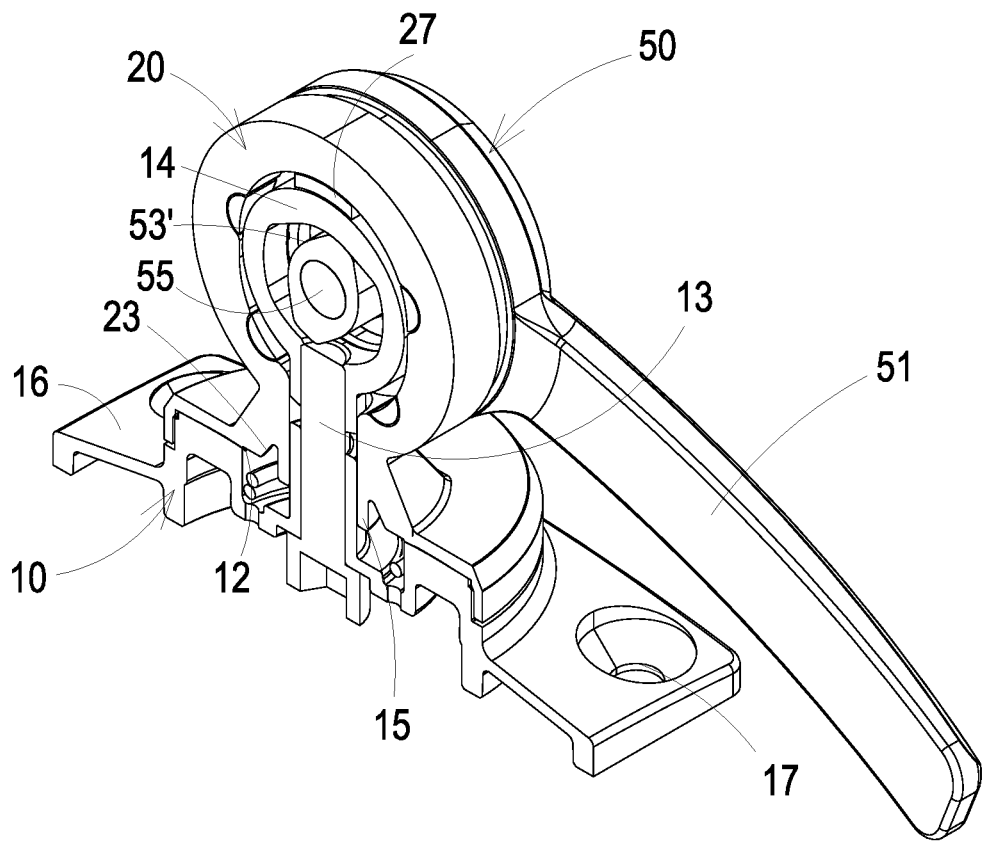
FIG. 14 is another cross-sectional structural view illustrating the three-dimensional angular adjusting and positioning device which is set in an angular positioned state according to the second embodiment of the present disclosure.

FIGS. 8 and 9 are exploded views illustrating a three-dimensional angular adjusting and positioning device according to a second embodiment of the present disclosure. FIG. 10 is a perspective structural view illustrating the three-dimensional angular adjusting and positioning device according to the second embodiment of the present disclosure. FIGS. 11 and 12 are cross-sectional structural views illustrating the three-dimensional angular adjusting and positioning device which is set in an adjustable state according to the second embodiment of the present disclosure. FIGS. 13 and 14 are cross-sectional structural views illustrating the three-dimensional angular adjusting and positioning device which is set in an angular positioned state according to the second embodiment of the present disclosure. In the embodiment, the structures, elements and functions of the three-dimensional angular adjusting and positioning device 1 are similar to those of the three-dimensional angular adjusting and positioning device 1 of FIGS. 1 to 7, and are not redundantly described herein. Furthermore, the operation states of FIGS. 11 to 14 are similar to those of FIGS. 4 to 7, and not redundantly described herein. In the embodiment, the eccentric cam 53' of the three-dimensional angular adjusting and positioning device 1 includes a symmetrical cross section. It facilitates the eccentric cam 53' to abut against the inner wall of the ring portion 14 smoothly and evenly. Furthermore, the first adjusting member 20 includes a plurality of inclined planes 25' disposed adjacent to an end of the accommodation opening 21 and matched with the at least one pushing portion 52. Preferably but not exclusively, the plurality of inclined planes 25' forms a swirling-ladder structure. It facilitates the user to feel the rotation of the arm 51 of the second sub-member 50. The present disclosure is not limited thereto and not redundantly described herein.

Figure 15:
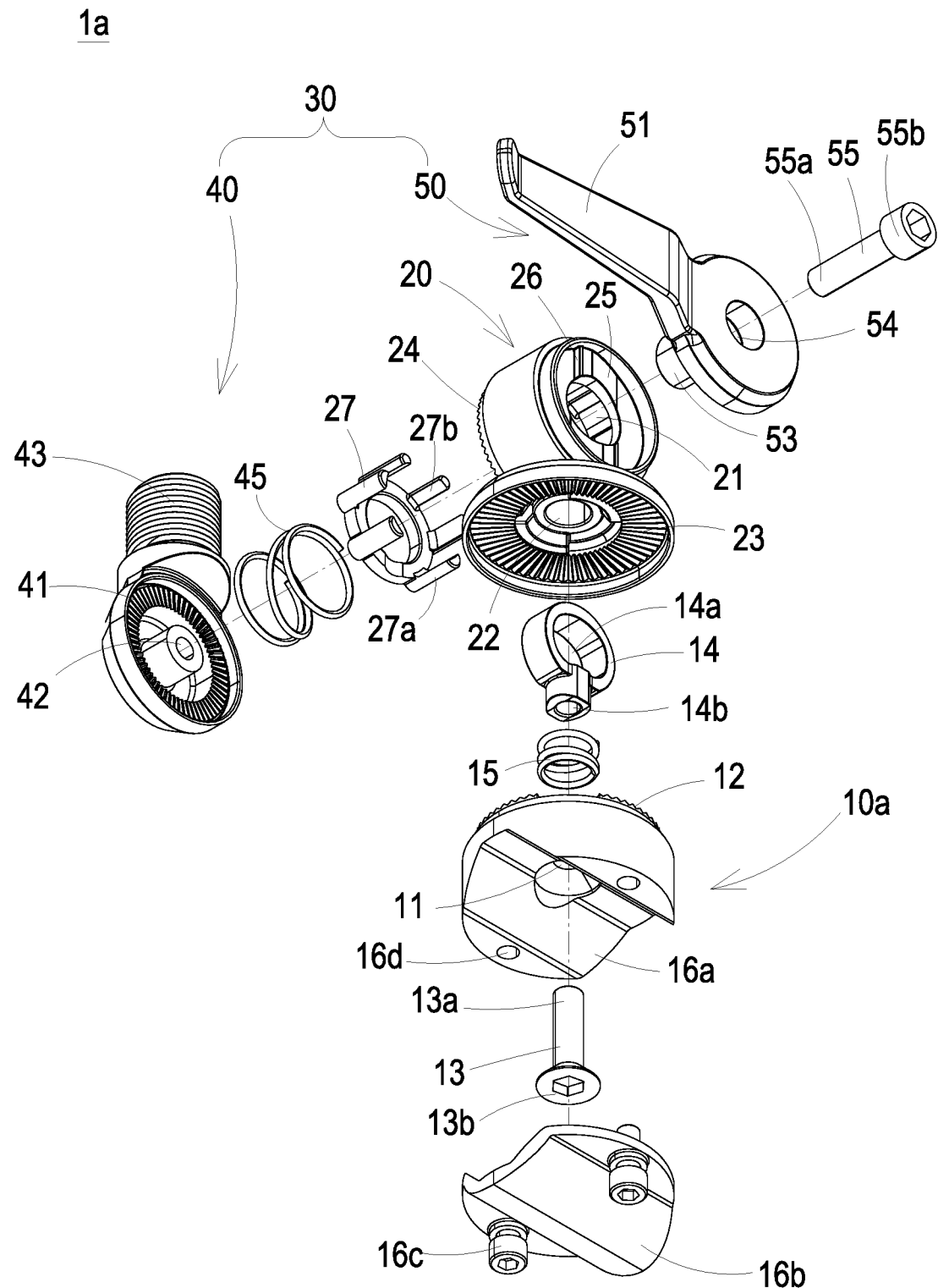
FIG. 15 is an exploded view illustrating a three-dimensional angular adjusting and positioning device according to a third embodiment of the present disclosure.
Figure 16:
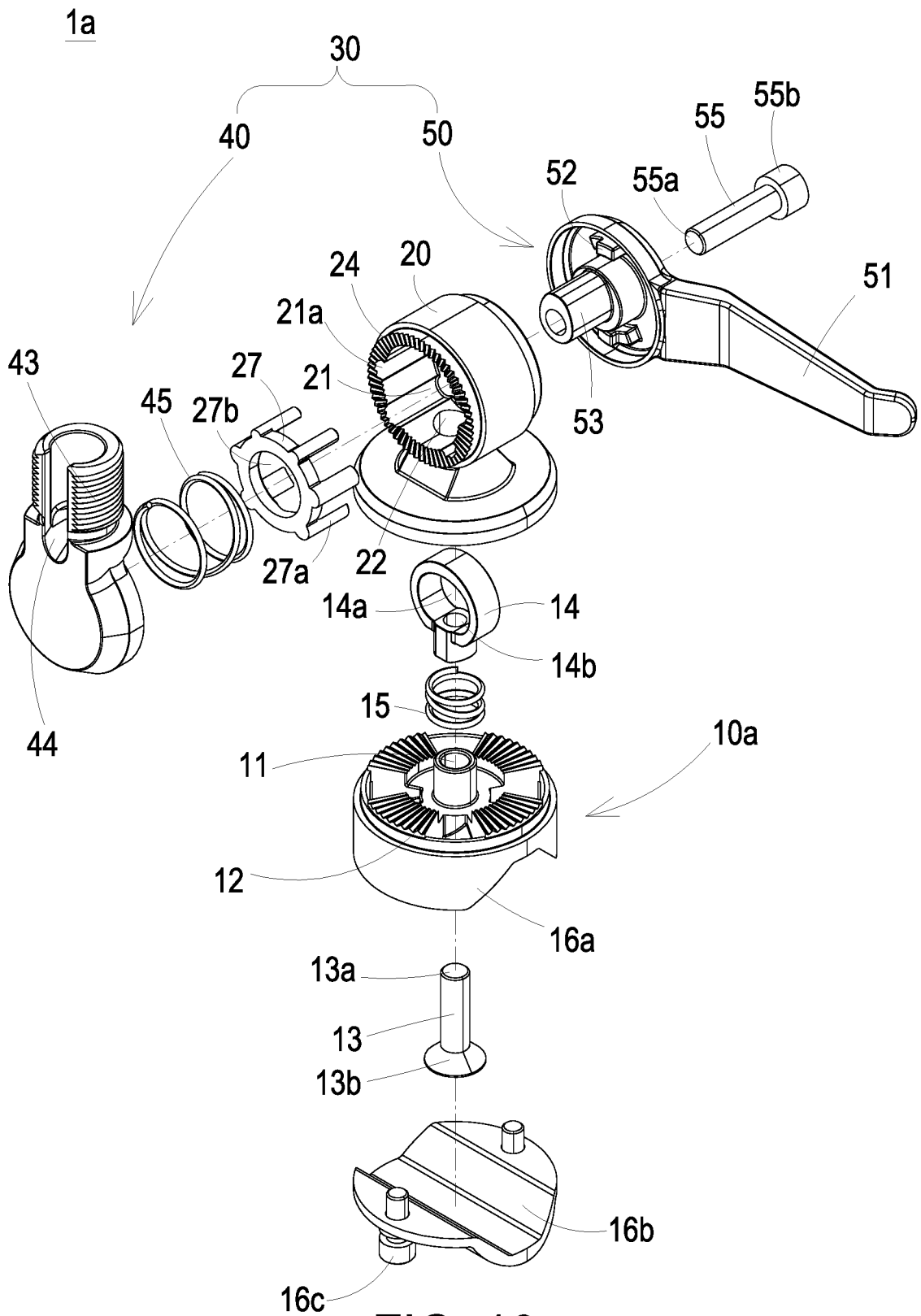
FIG. 16 is another explode view illustrating the three-dimensional angular adjusting and positioning device according to the third embodiment of the present disclosure and taken from a different perspective.
Figure 17:
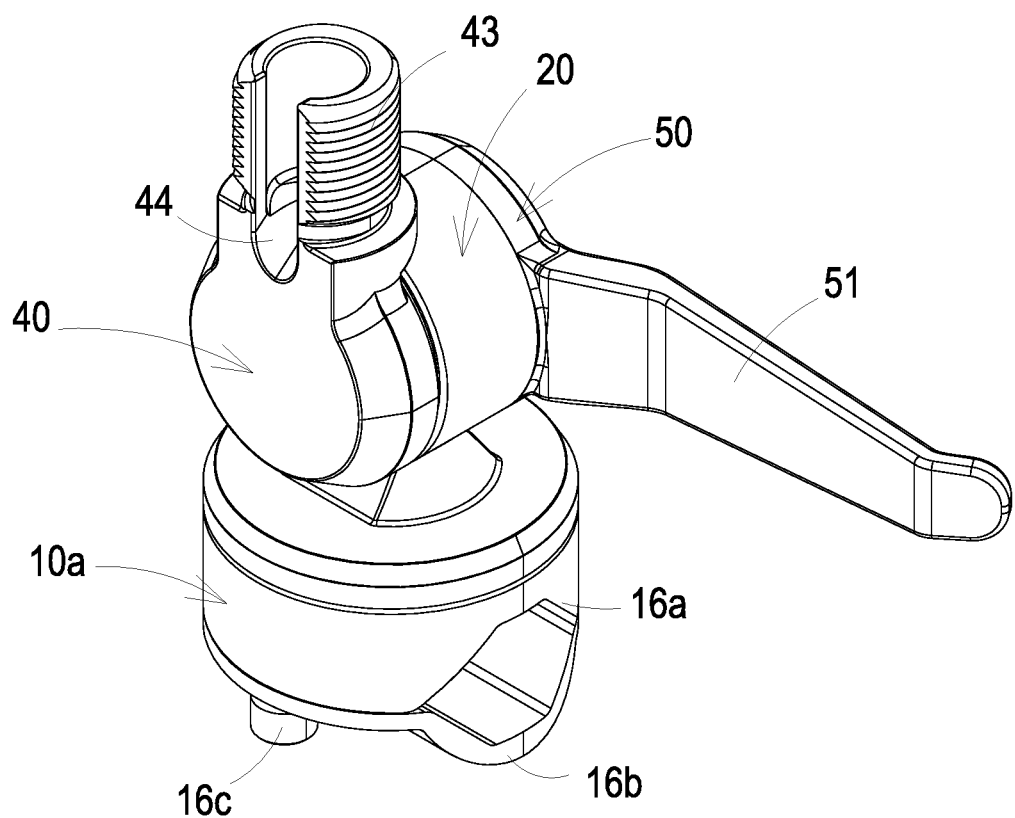
FIG. 17 is a perspective structural view illustrating the three-dimensional angular adjusting and positioning device according to the third embodiment of the present disclosure.
Figure 18:
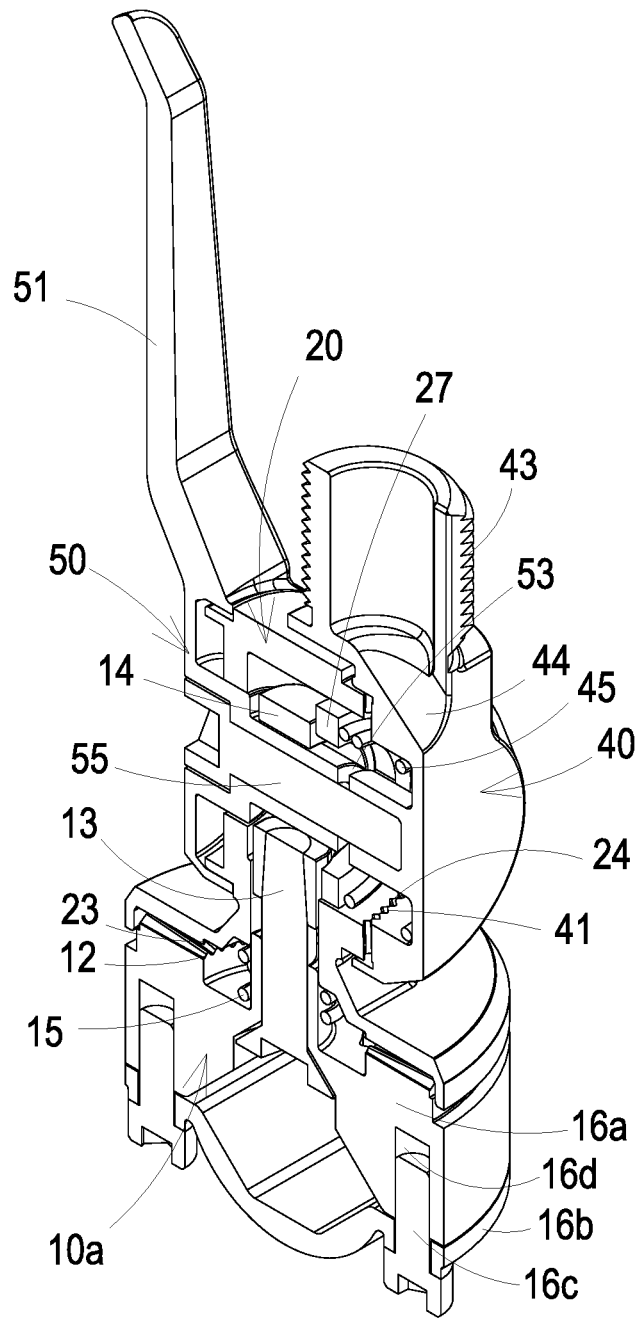
FIG. 18 is a cross-sectional structural view illustrating the three-dimensional angular adjusting and positioning device which is set in an adjustable state according to the third embodiment of the present disclosure.
Figure 19:
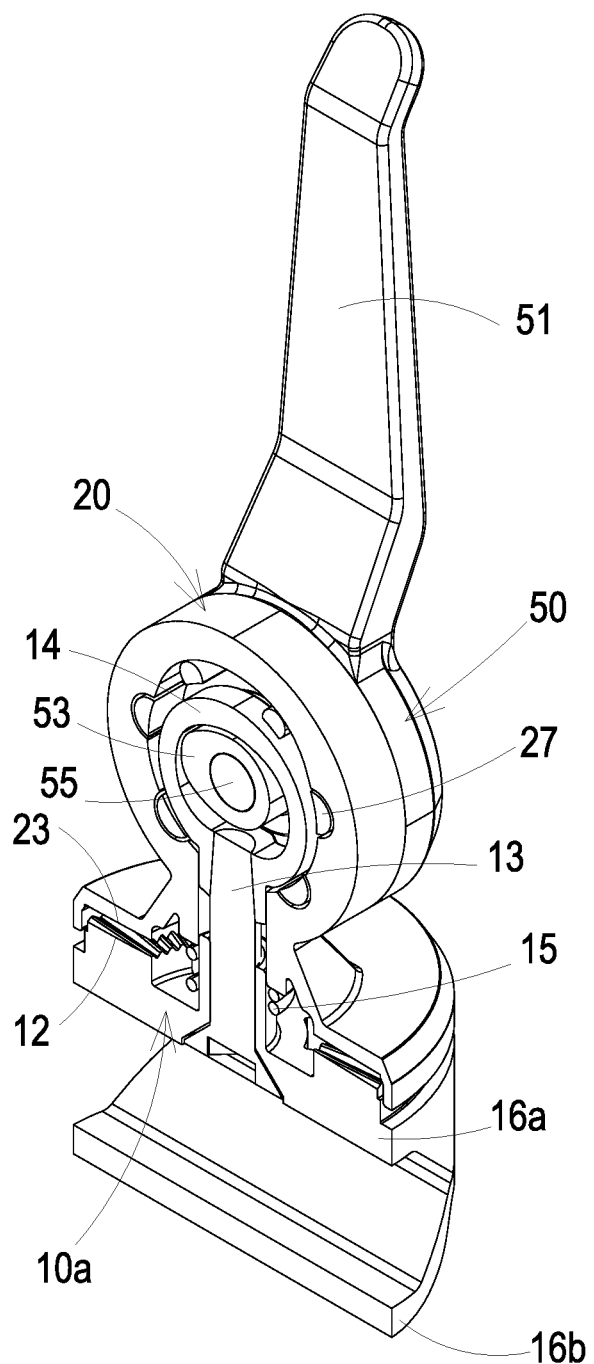
FIG. 19 is another cross-sectional structural view illustrating the three-dimensional angular adjusting and positioning device which is set in an angular adjustable state according to the third embodiment of the present disclosure.
Figure 20:
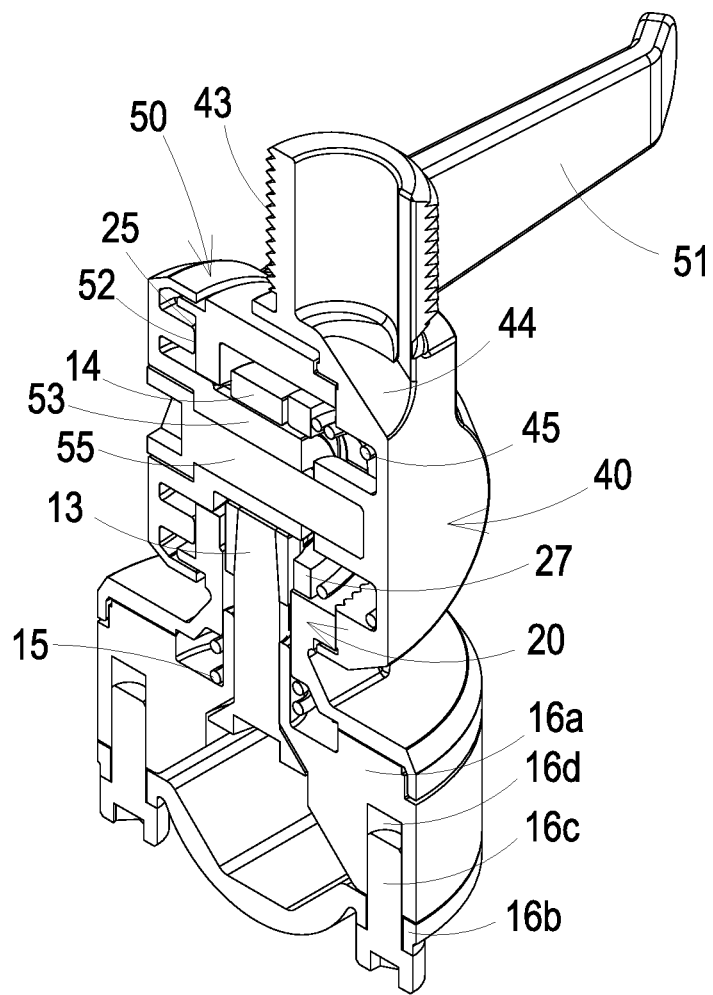
FIG. 20 is a cross-sectional structural view illustrating the three-dimensional angular adjusting and positioning device which is set in an angular positioned state according to the third embodiment of the present disclosure.
Figure 21:
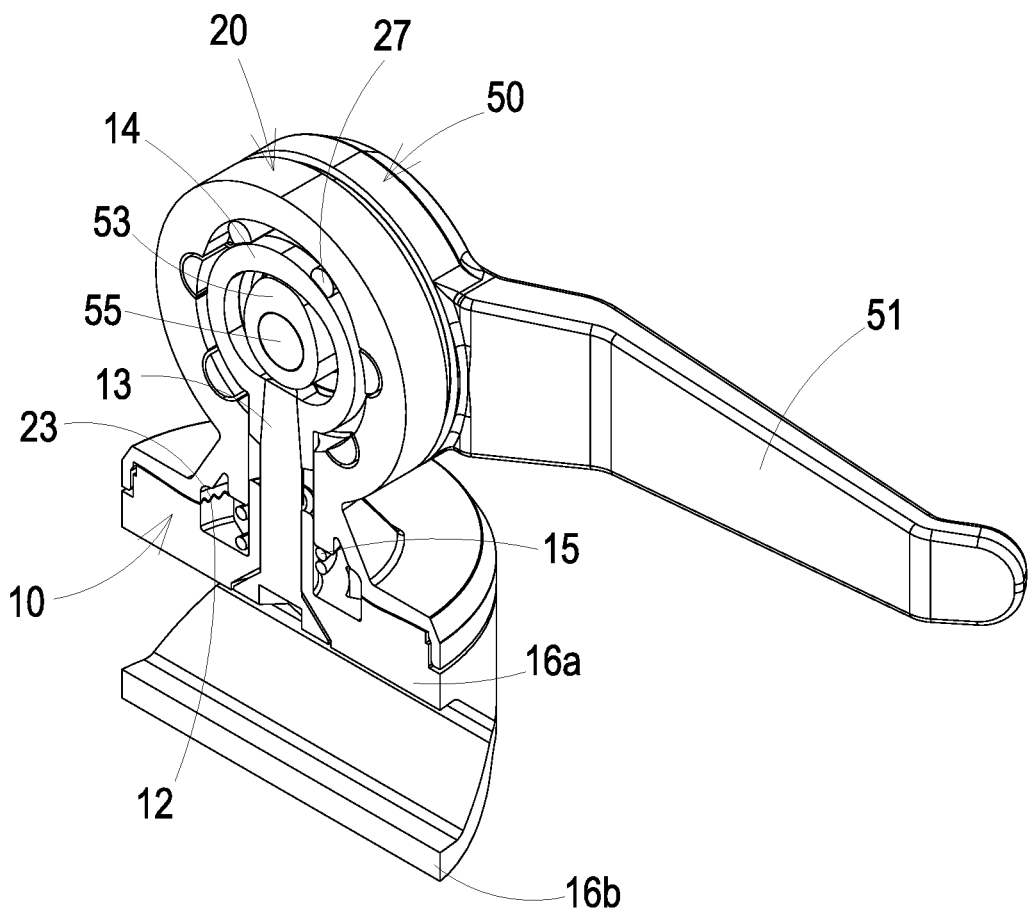
FIG. 21 is another cross-sectional structural view illustrating the three-dimensional angular adjusting and positioning device which is set in an angular positioned state according to the third embodiment of the present disclosure.

FIGS. 15 and 16 are exploded views illustrating a three-dimensional angular adjusting and positioning device according to a third embodiment of the present disclosure. FIG. 17 is a perspective structural view illustrating the three-dimensional angular adjusting and positioning device according to the third embodiment of the present disclosure. FIGS. 18 and 19 are cross-sectional structural views illustrating the three-dimensional angular adjusting and positioning device which is set in an adjustable state according to the third embodiment of the present disclosure. FIGS. 20 and 21 are cross-sectional structural views illustrating the three-dimensional angular adjusting and positioning device which is set in an angular positioned state according to the third embodiment of the present disclosure. In the embodiment, the structures, elements and functions of the three-dimensional angular adjusting and positioning device 1a are similar to those of the three-dimensional angular adjusting and positioning device 1 of FIGS. 1 to 7, and are not redundantly described herein. Different from the three-dimensional angular adjusting and positioning device 1 of FIGS. 1 to 7, in the embodiment, the fixing member 10a includes a base portion 16a and a clamping portion 16b. The base portion 16a and the clamping portion 16b are matched to each other. Moreover, the clamping portion 16b includes at least one first fastening component 16c and the base portion 16a includes at least one second fastening component 16d. The at least one first fastening component 16c and the at least one second fastening component 16d are engaged with other, so that the three-dimensional angular adjusting and positioning device 1a is fastened on an object (not shown) by the clamping and fixing function of the clamping portion 16b and the base portion 16a. Certainly, the fixing member 10, 10a of the three-dimensional angular adjusting and positioning device 1, 1a in the foregoing embodiments can be fastened on an object by the other fastening methods. Namely, the present disclosure is not limited to the foregoing descriptions. The fastening method of the three-dimensional angular adjusting and positioning device 1, 1a is adjustable according to the practical requirements and not redundantly described herein.

In the embodiment, when the arm 51 drives the second sub-member 50 to rotate around the second shaft 55 and misalign the above specific position, the at least one pushing portion 52 of the second sub-member 50 is shifted away from the at least one inclined plane 25 of the first adjusting member 20. Consequently, the eccentric cam 53 releases the inner wall of the ring portion 14 of the fixing member 10 and not in abutting with the ring portion 14. The first elastic component 15 drives the second engaging portion 23 of the first adjusting member 20 to move away the first engaging portion 12 of the fixing member 10. The second elastic component 45 drives the fourth engaging portion 41 of the first sub-member 40 to move away the third engaging portion 24 of the first adjusting member 20. In that way, the three-dimensional angular adjusting and positioning device 1a is set in the adjustable state, as shown in FIGS. 11 and 12. The first adjusting member 20 can be rotated freely to the first specific angle relative to the fixing member 10 around the first shaft 13 and the first sub-member 40 of the second adjusting member 30 can be rotated freely to the second specific angle relative to the first adjusting member 20 around the second shaft 55.

On the other hand, as shown in FIGS. 13 and 14. When the arm 51 drives the second sub-member 50 to rotate to a specific position relative to the first adjusting member 20 around the second shaft 55, the at least one pushing portion 52 abuts against the at least one inclined plane 25 to drive the fourth engaging portion 41 of the first sub-member 40 and the third engaging portion 24 of the first adjusting member 20 to engage with each other. At the same time, the eccentric cam 53 abuts against the inner wall of the ring portion 14 to drive the second engaging portion 23 of the first adjusting member 20 to move for example downwardly and engage with the first engaging portion 12 of the fixing member 10. Thus, the first adjusting member 20 and the first sub-member 40 of the second adjusting member 30 are positioned at the first specific angle and the second specific angle, respectively. Thus, the mounted and carried electronic equipment, such as the screen, the antenna or the other electronic equipment can be adjusted freely to achieve a specific angle according to the practical requirements and fastened at a specific position firmly. It avoids the angular displacement of the mounted and carried electronic equipment due to the collision or the gravity.

In summary, a three-dimensional angular adjusting and positioning device is provided. With an eccentric cam rotated by a single arm to switch the relative positions of the components, the engaging portions of the components are driven to separate or engage. Thereby, the three-dimensional angular adjusting and positioning device can be freely adjusted and positioned to a specific angle according to the practical requirements. Moreover, an electronic equipment can be mounted and carried thereon simply and it benefits to avoid the angular displacement of the mounted and carried electronic equipment due to the collision or the gravity. The structure of the three-dimensional angular adjusting and positioning device is compact and can be assembled easily. With an eccentric cam rotated by a single arm to switch the relative positions of the components, the engaging portions of the components are driven to separate or engage. Thereby, an electronic equipment mounted and carried on the three-dimensional angular adjusting and positioning device can be freely adjusted and positioned to a specific angle according to the practical requirements. It also benefits to avoid the angular displacement of the mounted and carried electronic equipment due to the collision or the gravity. In addition, the angular adjusting and positioning operations are performed without an additional tool. An eccentric cam disposed therein is rotated by a single arm to switch the relative positions of the components, and the engaging portions of the components are driven to separate or engage, so as to achieve the operations of fastening or unfastening. It facilitates the three-dimensional angular adjusting and positioning device to be freely adjusted and positioned at a specific angle according to the practical requirements and then fastened firmly at the specific angle.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A three-dimensional angular adjusting and positioning device, comprising:

a fixing member, comprising a base portion, a first engaging portion, a first shaft and a ring portion, wherein the first engaging portion is disposed on the base portion, the ring portion comprises a sleeving opening, and the ring portion and the base portion are in connection with two opposite ends of the first shaft, respectively;

a first adjusting member comprising an accommodation opening, a shaft channel, a second engaging portion, a third engaging portion and at least one inclined plane, wherein the accommodation opening is in communication with a first end of the shaft channel, and the first adjusting member is pivotally connected with the fixing member by the first shaft located through the shaft channel so as to rotate the first adjusting member to a first specific angle relative to the fixing member around the first shaft, wherein the ring portion of the fixing member is accommodated within the accommodation opening, the second engaging portion is matched with the first engaging portion and disposed adjacent to a second end of the shaft channel, and the third engaging portion and the at least one inclined plane are disposed adjacent to two opposite ends of the accommodation opening, respectively; and a second adjusting member comprising a first sub-member and a second sub-member disposed adjacent to the two opposite ends of the accommodation opening, respectively, wherein the first sub-member comprises a fourth engaging portion matched with the third engaging portion, wherein the second sub-member comprises a second shaft, an eccentric cam, at least one pushing portion and an arm, the at least one pushing portion is matched with the at least one inclined plane, the second shaft runs through the accommodation opening and the ring portion, and the first sub-member is connected with the second shaft to rotate to a second specific angle relative to the first adjusting member around the second shaft, wherein the eccentric cam is disposed around the second shaft and received within the sleeving opening of the ring portion, wherein when the arm drives the second sub-member to rotate to a specific position relative to the first adjusting member around the second shaft, the at least one pushing portion abuts against the at least one inclined plane to drive the fourth engaging portion of the first sub-member to engage with the third engaging portion of the first adjusting member, and the eccentric cam abuts against the ring portion to drive the second engaging portion of the first adjusting member to engage with the first engaging portion of the fixing member, so that the first adjusting member and the first sub-member of the second adjusting member are positioned at the first specific angle and the second specific angle, respectively.

2. The three-dimensional angular adjusting and positioning device according to claim 1, wherein the fixing member comprises a first elastic component disposed between the fixing member and the first adjusting member, wherein the first sub-member comprises a second elastic component disposed between the first sub-member and the first adjusting member, wherein when the arm drives the second adjusting member to rotate to the specific position around the first second shaft, the at least one pushing portion is misaligned with the at least one incline plane and the eccentric cam release the ring portion, so that the first elastic component drives the second engaging portion of the first adjusting member to space apart from the first engaging portion of the fixing member, and the second elastic component drives the fourth engaging portion of the first sub-member to space apart from the third engaging portion of the first adjusting member.

3. The three-dimensional angular adjusting and positioning device according to claim 2, wherein first adjusting member comprises a mounting ring set disposed within the accommodation opening and partially covering around the outer edge of the ring portion, so as to limit the ring portion within the accommodation opening.

4. The three-dimensional angular adjusting and positioning device according to claim 3, wherein the mounting ring set comprises a through opening aligned with the sleeving opening of the ring portion, so that the second shaft is located through the through opening and the sleeving opening.

5. The three-dimensional angular adjusting and positioning device according to claim 4, wherein the second elastic component is located between the first sub-member and the mounting ring set of the first adjusting member.

6. The three-dimensional angular adjusting and positioning device according to claim 4, wherein the fixing member comprises a first fastening hole disposed on the base portion, wherein the first shaft comprises a pivoting end and stopper end disposed relative to each other, the stopper end is mounted on an end of the first fastening hole, the first shaft is extended outwardly from another end of the first fastening hole and located through the shaft channel, and the ring portion is pivotally connected with the pivoting end.

7. The three-dimensional angular adjusting and positioning device according to claim 3, wherein the first adjusting member comprises a plurality of positioning slots located through the accommodation opening and disposed around the accommodation opening, wherein the mounting ring set comprises a plurality of supporting pins spatially corresponding to the plurality of positioning slots and disposed around the ring portion, to firmly mount the mounting ring set in the accommodation opening and limit the ring portion in the accommodation opening.

8. The three-dimensional angular adjusting and positioning device according to claim 1, wherein the fixing member comprises at least one fixing hole and configured to fasten the three-dimensional angular adjusting and positioning device on an object by at least one bolt engaging with the fastening hole.

9. The three-dimensional angular adjusting and positioning device according to claim 1, wherein the fixing member comprises a clamping portion matched with base portion, wherein the clamping portion comprises at least one first fastening component and the base portion comprises at least one second fastening component, wherein the at least one first fastening component and the at least one second fastening component are engaged with other to fasten the three-dimensional angular adjusting and positioning device on an object.

10. The three-dimensional angular adjusting and positioning device according to claim 1, wherein the second sub-member comprises a second fastening hole disposed thereon, wherein the second shaft comprises a pivoting end and a stopper end disposed relative to each other, the stopper end is mounted on an end of the second fastening hole, the second shaft is extended outwardly from another end of the second fastening hole and located through the accommodation opening and the ring portion, and the first sub-member is pivotally connected with the pivoting end.

11. The three-dimensional angular adjusting and positioning device according to claim 1, wherein the first sub-member comprises a mounting portion disposed on an edge of the first sub-member, wherein when the first adjusting member is rotated to the first specific angle relative to the fixing member around the first shaft and the first sub-member is rotated to the second specific angle relative to the first adjusting member around the second shaft, a relative angle is formed between the mounting portion and the fixing member.

12. The three-dimensional angular adjusting and positioning device according to claim 11, wherein the first sub-member comprises an accommodation groove disposed adjacent to the mounting portion.

13. The three-dimensional angular adjusting and positioning device according to claim 1, wherein the first engaging portion and the second engaging portion are disposed around an outer edge of the first shaft, and the third engaging portion and the fourth engaging portion are disposed around an outer edge of the second shaft.

14. The three-dimensional angular adjusting and positioning device according to claim 1, wherein the first adjusting member comprises at least one limitation portion disposed adjacent to the at least one inclined plane to limit a rotated angle of the second sub-member relative to the first adjusting member around the second shaft.

15. The three-dimensional angular adjusting and positioning device according to claim 1, wherein the at least one inclined plane comprises a plurality of planes forming a swirling-ladder structure.

16. The three-dimensional angular adjusting and positioning device according to claim 1, wherein the eccentric cam comprises a symmetrical cross section.

* * * * *